United States Patent
Kikuchi et al.

(10) Patent No.: US 9,642,287 B2
(45) Date of Patent: May 2, 2017

(54) COOLING PLATE AND DATA PROCESSING SYSTEM PROVIDED WITH COOLING PLATES

(71) Applicant: FUJITSU LIMITED, Kawasaki-shi, Kanagawa (JP)

(72) Inventors: Shunichi Kikuchi, Yokohama (JP); Yoshihisa Iwakiri, Kawasaki (JP); Naoaki Nakamura, Kawasaki (JP); Hiroshi Onuki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/156,375

(22) Filed: May 17, 2016

(65) Prior Publication Data

US 2016/0366793 A1    Dec. 15, 2016

(30) Foreign Application Priority Data

Jun. 12, 2015   (JP) ................. 2015-119322

(51) Int. Cl.
*H05K 7/20*   (2006.01)
*F25D 15/00*   (2006.01)
(Continued)

(52) U.S. Cl.
CPC ......... *H05K 7/20781* (2013.01); *F28D 15/00* (2013.01); *F28F 9/0204* (2013.01);
(Continued)

(58) Field of Classification Search
CPC  H05K 7/20781; H05K 7/20736; F28D 15/00; F28D 2021/0028; F28F 9/026; F28F 9/0204; F28F 2270/00
(Continued)

(56) References Cited

U.S. PATENT DOCUMENTS

2004/0008487  A1*  1/2004  Hisano ............... H05K 7/20254
                                                361/690
2005/0082040  A1*  4/2005  Lee .......................... F28F 3/12
                                                165/104.33
(Continued)

FOREIGN PATENT DOCUMENTS

JP   2004-095711   3/2004
JP   2009-194038   8/2009

OTHER PUBLICATIONS

W. Escher et al., "Experimental Investigation of an Ultrathin Manifold Microchannel Heat Sink for Liquid-Cooled Chips", Journal of Heat Transfer, Aug. 2010, vol. 132, pp. 081402-1 to 081402-10 (10 pages).

*Primary Examiner* — Anthony Haughton
*Assistant Examiner* — Yahya Ahmad
(74) *Attorney, Agent, or Firm* — Fujitsu Patent Center

(57) ABSTRACT

A channel distribution type cooling plate where a space between a first coolant storage part for inflow of coolant and a second cooling storage part for outflow of coolant formed at the two ends of an upper space of a main body provided with a lower space for removing heat of a heat generating member is partitioned by a meandering type partition wall to form coolant distribution paths connected to the first coolant storage part and coolant collection paths connected to the second coolant storage part, the bottom of the coolant distribution paths and the coolant collection paths are communicated by a plurality of through holes with the lower space, and side surfaces of the partition wall at the coolant distribution path sides are formed with subchannels for running coolant from the first coolant storage part, in order to improve the cooling efficiency at the coolant outlet side.

13 Claims, 14 Drawing Sheets

(51) Int. Cl.
   *F28F 9/02* (2006.01)
   *F28D 21/00* (2006.01)
   *F28D 15/00* (2006.01)

(52) U.S. Cl.
   CPC ......... *F28F 9/026* (2013.01); *H05K 7/20736* (2013.01); *F28D 2021/0028* (2013.01); *F28F 2270/00* (2013.01)

(58) Field of Classification Search
   USPC ............ 361/679.46, 679.47, 679.52–679.54, 361/699–711; 165/80.1–80.5, 185
   See application file for complete search history.

(56) References Cited

U.S. PATENT DOCUMENTS

| | | | | |
|---|---|---|---|---|
| 2006/0032611 | A1* | 2/2006 | Fujisaki | H01L 23/473 165/80.4 |
| 2011/0272121 | A1* | 11/2011 | Suzuki | H01L 23/473 165/104.19 |
| 2011/0272128 | A1* | 11/2011 | Suzuki | F28D 1/0476 165/185 |
| 2014/0239486 | A1* | 8/2014 | Gohara | H01L 23/3735 257/714 |
| 2015/0140388 | A1* | 5/2015 | Harada | H01M 10/617 429/120 |
| 2016/0100504 | A1* | 4/2016 | Iwasaki | H05K 7/20272 165/84 |
| 2016/0379914 | A1* | 12/2016 | Arai | H01L 25/072 257/714 |

\* cited by examiner

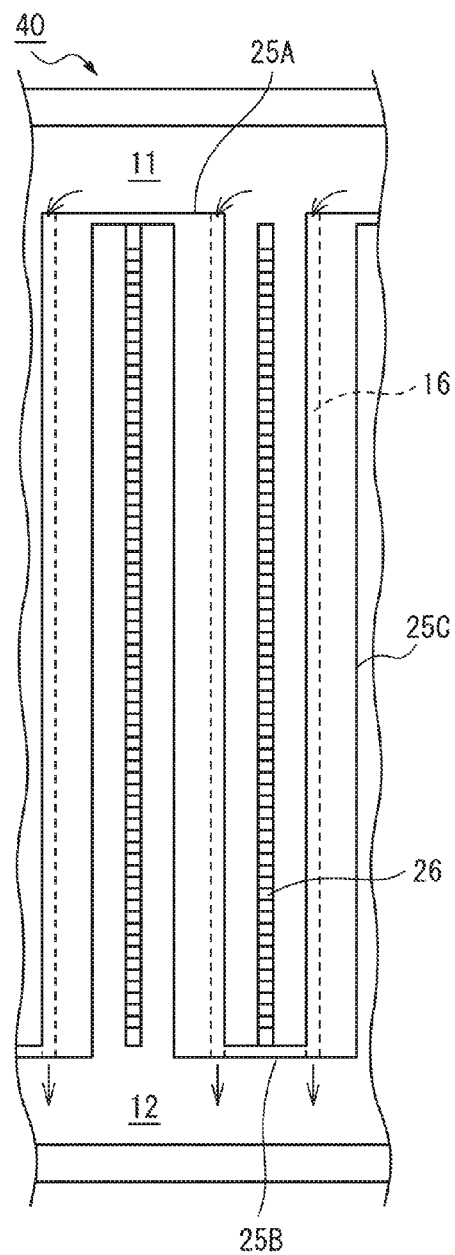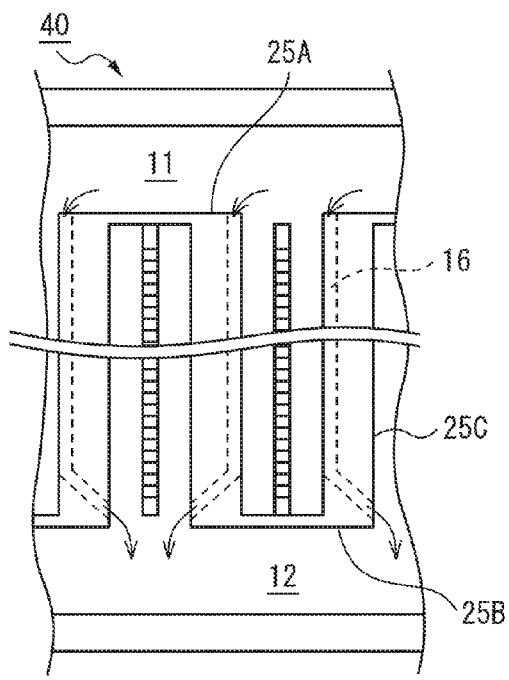

FIG. 14A
FIG. 14B
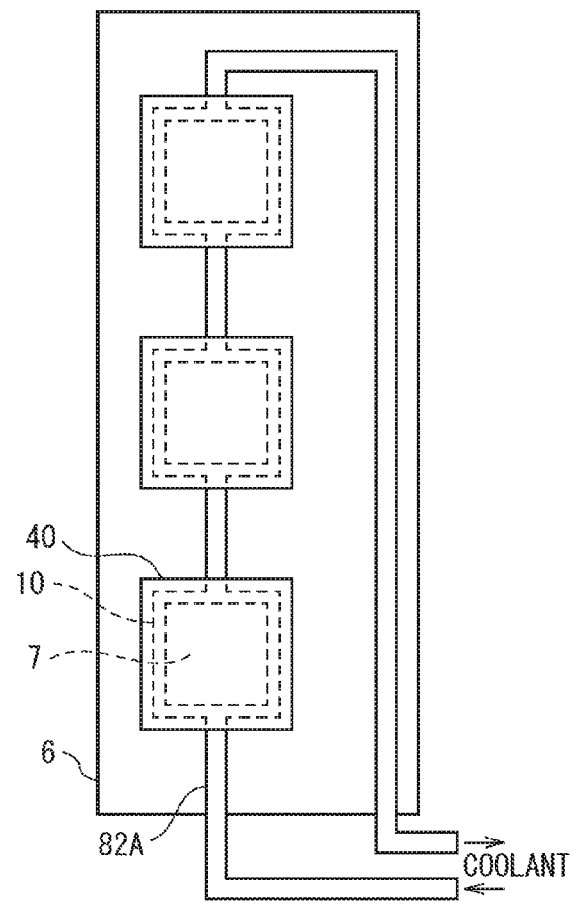
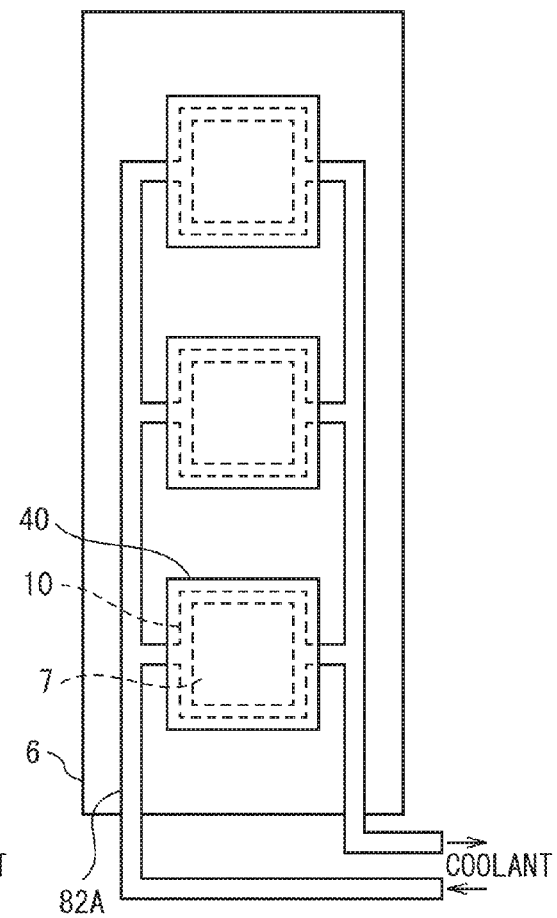

COOLING PLATE AND DATA PROCESSING SYSTEM PROVIDED WITH COOLING PLATES

CROSS-REFERENCE TO RELATED APPLICATION

This application claims priority from, and incorporates by reference the entire disclosure of, Japanese Patent Application No. 2015-119322, filed on Jun. 12, 2015.

FIELD

The present application relates to a cooling plate and a data processing system provided with cooling plates.

BACKGROUND

In recent years, servers, supercomputers, and other electronic equipment have become faster in speed and higher in performance. Along with this, the amount of heat generated by the electronic devices built into the electronic equipment (for example, central processing units (CPUs)) at the time of operation has been increasing. In general, servers and other such electronic equipment include a plurality of electronic devices. The amount of heat generated by these is tremendous. Further, if the heat generated by the electronic devices causes the inside of the electronic equipment to become high in temperature, the electronic equipment will be impaired in function and breakdown of the electronic equipment will be caused. Therefore, to maintain the functions of electronic devices and avoid breakdown of the electronic equipment, it is necessary to cool the heat generating electronic devices. As a device for cooling an electronic device, a cooler called a "cooling plate" which is arranged with its main body in contact with the electronic device and runs a coolant through the inside of the main body to cool the electronic device is known. The coolant which is raised in temperature after cooling the electronic device is cooled by a cooling device which is provided at the outside of the cooler and is then refluxed to the cooler.

As such a cooler, a cooler which cools a semiconductor module provided with a plurality of semiconductor devices built in a power conversion device and a jet type cooler having a plurality of headers for cooling a power electronic device are known. Further, a channel distribution type cooler is also known.

In this regard, most of the coolers up to now have been structured to be supplied with coolant raised in temperature at the downstream side of the coolant flow, so there has been the problem of the temperature of a downstream side semiconductor module becoming higher.

As opposed to this, a channel distribution type cooler is divided into channels through which the coolant before cooling the heat generating member flows (distribution paths) and a channel through which the coolant after cooling the heat generating member flows (collection path) and is high in cooling efficiency of the heat generating member. Here, using FIG. 1 to FIG. 6, a channel distribution type cooler (below, referred to as a "cooling plate") will be explained.

FIG. 1 illustrates a standalone apparatus 90 which is provided with air-cooling systems and liquid cooling systems of the comparative art. In a liquid cooling system which cools cooling plates, a cooling system jointly using an air-cooling system is built in. At the front side of the standalone apparatus 90, a plurality of CPU units 91 provided with liquid cooling systems are mounted. The CPU units 91 are supplied with coolant from a coolant cooling device 30 provided separately from the standalone apparatus 90. On the other hand, at the back side of the standalone apparatus 90, air-cooling system use fans 92, 93 are provided.

FIG. 2A illustrates the layout of an air-cooling system 94 and a liquid cooling system 80 in a CPU unit 91 mounted in the standalone apparatus 90 illustrated in FIG. 1. A circuit board 96 of a CPU unit 91 has memory devices 95 and concealed CPUs and interface devices. The memory devices 95 are cooled by the cooling air CW of the air-cooling system 94. The liquid cooling system 80 has cooling plates 83 for cooling the CPUs and cooling plates 84 for cooling interface devices and is connected through coolant piping 82 (coolant feed pipes 82A and coolant recovery pipes 82B) to a coolant inlet 81 and a coolant outlet 85. The coolant inlet 81 and the coolant outlet 85 are connected to the coolant cooling device 30 illustrated in FIG. 1A.

FIG. 2B explains the cooling operation of the air-cooling system 94 and the liquid cooling system 80 in the CPU unit 91 illustrated in FIG. 2A. In the air-cooling system 94, memory devices 95 provided on the circuit board 96 are cooled by the cooling air CW, while the coolant piping 82 of the liquid cooling system 80 is arranged in a direction perpendicular to the flow of cooling air CW. The coolant piping 82 connected to the coolant inlet 81 is provided with a coolant feed pipes 82A arranged from one end to the other end of the circuit board 96 and coolant recovery pipes 82B folded back at the other end and returning to the coolant outlet 85. In this example, two systems of the coolant feed pipes 82A and the coolant recovery pipes 82B are respectively provided.

In the middle of each coolant feed pipe 82A, a plurality of cooling plates 83 for cooling the CPUs and a plurality of cooling plates 84 for cooling the interface devices are provided, but nothing is provided in the middle of each coolant recovery pipe 82B. Coolant entering from the coolant inlet 81 runs through the coolant feed pipes 82A and flows successively through the plurality of cooling plates 83 to cool the CPUs, then flows successively through the plurality of cooling plates 84 to cool the interface devices, then runs through the coolant recovery pipes 83B and is returned to the coolant outlet 85.

FIG. 3 illustrates the structure of a cooling plate 20 of one example of the cooling plates 83 and 84 illustrated in FIG. 2A. The cooling plate 20 is provided with a main body 21 sealed by a top plate 22. On the top plate 22, there are a coolant inflow pipe 23 provided with a coolant inlet 23A connected to a coolant feed pipe 82A illustrated in FIGS. 2A and 2B and a coolant outflow pipe 24 provided with a coolant outlet 24A connected to a coolant recovery pipe 82B. The cooling plate 20 is placed with its main body 21 sitting on a heat generating device 97 mounted on the circuit board 96 and absorbs heat generated by the heat generating device 97 to thereby remove heat from the heat generating device 97.

FIG. 4 illustrates the structure of the inside of the main body 21 when taking off the top plate 22 of the cooling plate 20 illustrated in FIG. 3 to which the coolant inflow pipe 23 and the coolant outflow pipe 24 are attached. The inside of the main body 21 is divided by a later explained separating wall 5 into an upper space 10 and a lower space not illustrated in FIG. 4. At the inside of the upper space 10, there is a first channel and a second channel partitioned by a partition wall 25. The first channel is provided with a first coolant storage part 11 storing the coolant flowing in from the coolant inflow pipe 23 and a coolant distribution path 13 guiding the coolant in the first coolant storage part 11 in the direction of the coolant outflow pipe 24 and running it through the through holes 26 provided in the separating wall 5 to flow to the lower space. The second channel has a coolant collection path 14 which runs a coolant returning from the lower space through the through holes 26 provided in the separating wall 5 in the direction of the coolant outflow pipe 24 and a second coolant storage part 12 which stores the coolant flowing in from the coolant collection path 14 and sends it out to the coolant outflow pipe 24. The coolant returning from the lower space through the through holes 26 is coolant after absorbing the heat of the heat generating member at the lower space.

The partition wall 25 partitioning the upper space 10 is of a meandering shape including folded back walls 25A at the first coolant storage part 11 side and folded back walls 25B at the second coolant storage part 12 side. The folded back walls 25A, 25B are connected by parallel side walls 25C. The plurality of coolant distribution paths 13 connected to the first coolant storage part 11 are formed surrounded by the side walls 25C and the inner circumferential surfaces of the folded back walls 25B. At the separating wall 5 forming the bottom surfaces of the coolant distribution paths 13, through holes 26 are formed from the first coolant storage part 11 side toward the inner circumferential surfaces of the folded back walls 25B. The coolant collection paths 14 are formed surrounded by the side walls 25C and the inner circumferential surfaces of the folded back walls 25A, while the separating wall 5 forming the bottom surfaces of the coolant collection paths 14 are formed with through holes 26 from the inner circumferential surface side of the folded back walls 25B toward the second coolant storage part 12. The through holes 26 of this example are provided in straight lines at the center parts of the coolant distribution paths 13 and the bottom surfaces of the coolant collection paths 14, but the through holes 26 need not be straight lines and are not particularly determined in form. The parts with hatching in FIG. 4 are the parts connecting with the bottom surface of the top plate 22.

FIG. 5A illustrates the main body 21 of the first coolant storage part 11 side when cutting along the line A-A the main body 21 from which the top plate 22 of the cooling plate 20 illustrated in FIG. 4 has been removed. FIG. 5A illustrates the lower space 15 provided at the lower side of the upper space 10 by the separating wall 5. In the lower space 15, coolant flows in through the through holes 26 from the coolant distribution paths 13, passes over the bottom surface 1B of the main body 1, and absorbs the heat generated by a heat generating member under the bottom surface 1B to remove heat from the heat generating member. The coolant absorbing the heat of the heat generating member passes through the through holes 26 and flows in from the lower space 15 to the coolant collection paths 14. Accordingly, the lower space 15 is a heat removing coolant chamber removing the heat of the heat generating member. Below, the lower space 15 will also be described as the "heat removing coolant chamber 15".

FIG. 5B and FIG. 6 are explanatory views for explaining the flow of coolant in the cooling plate 20. The cooling flowing into the coolant inflow pipe 23 passes through the first coolant storage part 11 and enters the plurality of coolant distribution paths 13. The coolant entering the coolant distribution paths 13 flows along the coolant distribution paths 13 while flowing into the heat removing coolant chamber 15 through the through holes 26 and absorbing the heat generated by a heat generating device (not illustrated) in contact with the bottom surface 21B of the main body 21. The coolant absorbing the heat of the heat generating device runs from the heat removing coolant chamber 15 through the through holes 26 to enter the coolant collection paths 14, flows through the coolant collection paths 14 in the same direction as the coolant flowing through the coolant distribution paths 13, and is collected at the second coolant storage part 12. The coolant collected at the second coolant storage part 12 is drained from the coolant outflow pipe 24 illustrated in FIG. 4 to the outside of the cooling plate 20.

Note that, in the above explained cooling plate 20, the first coolant storage part 11 is a single space to which a plurality of coolant distribution paths 13 are connected. The second coolant storage part 12 is also a single space to which a plurality of coolant collection paths 14 are connected. On the other hand, the first coolant storage part 11 may be partitioned into sections for the individual coolant distribution paths 13 by sectioning walls provided at the outside of the folded back walls 25A of the partition wall 25. Similarly, the second coolant storage part 12 may also be partitioned into sections for the individual coolant collection paths 14 by sectioning walls provided at the outside of the folded back walls 25B of the partition wall 25. Further, in FIG. 5B, the ceiling plate 22 is drawn as a separate member from the main body 21, but the ceiling plate 22 is sometimes formed by the same member as the main body 21 and the overall assembly is called the "main body".

In this regard, in the channel distribution type cooling plate 20 in the comparative art as well, as illustrated in FIG. 6, the side walls 25C of the partition wall 25 separating the coolant distribution paths 13 and coolant collection paths 14 are warmed by the coolant flowing through the coolant collection paths 14 and take on the heat H. This being so, due to the conduction of heat from the side walls 25C, the coolant flowing through the coolant distribution paths 13 gradually rises in temperature as it flows to the downstream sides of the coolant distribution paths 13. As a result, the heat removing coolant chamber 15 positioned at the downstream part of the coolant distribution paths 13 is supplied with coolant raised in temperature and therefore there is the problem that the heat generating device positioned at the downstream side of the coolant distribution paths 13 becomes higher in temperature.

As a technique for solving this problem, it may be considered to make the partition wall 25 separating the coolant distribution paths 13 and coolant collection paths 14 a material resistant to heat conduction. However, with this technique, there is the problem that the cooling performance of the cooling plate as a whole remarkably falls and the heat removing surface (bottom surface 21B of main body 20) as a whole rises in temperature.

SUMMARY

According to one aspect, there is provided a cooling plate comprising a main body provided with an upper space and a lower space separated by a separating wall and having a bottom surface placed on a heat generating member, a partition wall provided sticking out at the upper space side of the separating wall and partitioning the inside of the upper space into a first channel through which the coolant before absorbing heat flows and a second channel through which the coolant after absorbing heat of the heat generating member flows, a plurality of through holes provided in the separating wall for running the coolant in the first channel into the lower space and running the coolant in the lower space into the second channel, and a third channel provided in the partition wall and running part of the coolant before absorbing heat.

According to another aspect, there is provided a data processing system provided with cooling plates which use a coolant to cool heat generating devices mounted on a board on which data processing circuits are formed, a cooling plate comprising a main body provided with an upper space and a lower space separated by a separating wall and having a bottom surface placed on a heat generating member, a partition wall provided sticking out at the upper space side of the separating wall and partitioning the inside of the upper space into a first channel through which the coolant before absorbing heat flows and a second channel through which the coolant after absorbing heat of the heat generating member flows, a plurality of through holes provided in the separating wall for running the coolant in the first channel into the lower space and running the coolant in the lower space into the second channel, and a third channel provided in the partition wall and running part of the coolant before absorbing heat.

BRIEF DESCRIPTION OF DRAWINGS

FIG. 12A is a partial plan view showing a first embodiment of a cooling plate.

FIG. 12B is a partial plan view of a modified embodiment of the first embodiment of a cooling plate.

FIG. 14A is a view of the configuration of a first embodiment of a data processing system provided with cooling plates.

FIG. 14B is a view of the configuration of a second embodiment of a data processing system provided with cooling plates.

DESCRIPTION OF EMBODIMENTS

Below, the attached drawings will be used to explain aspects of the present application based on specific embodiments. Note that in the explanation of the cooling plate in one aspect of the disclosure, the same component members as the cooling plate 20 in the comparative art explained using FIG. 1 to FIG. 6 will be assigned the same references for explanation.

Figure 1:
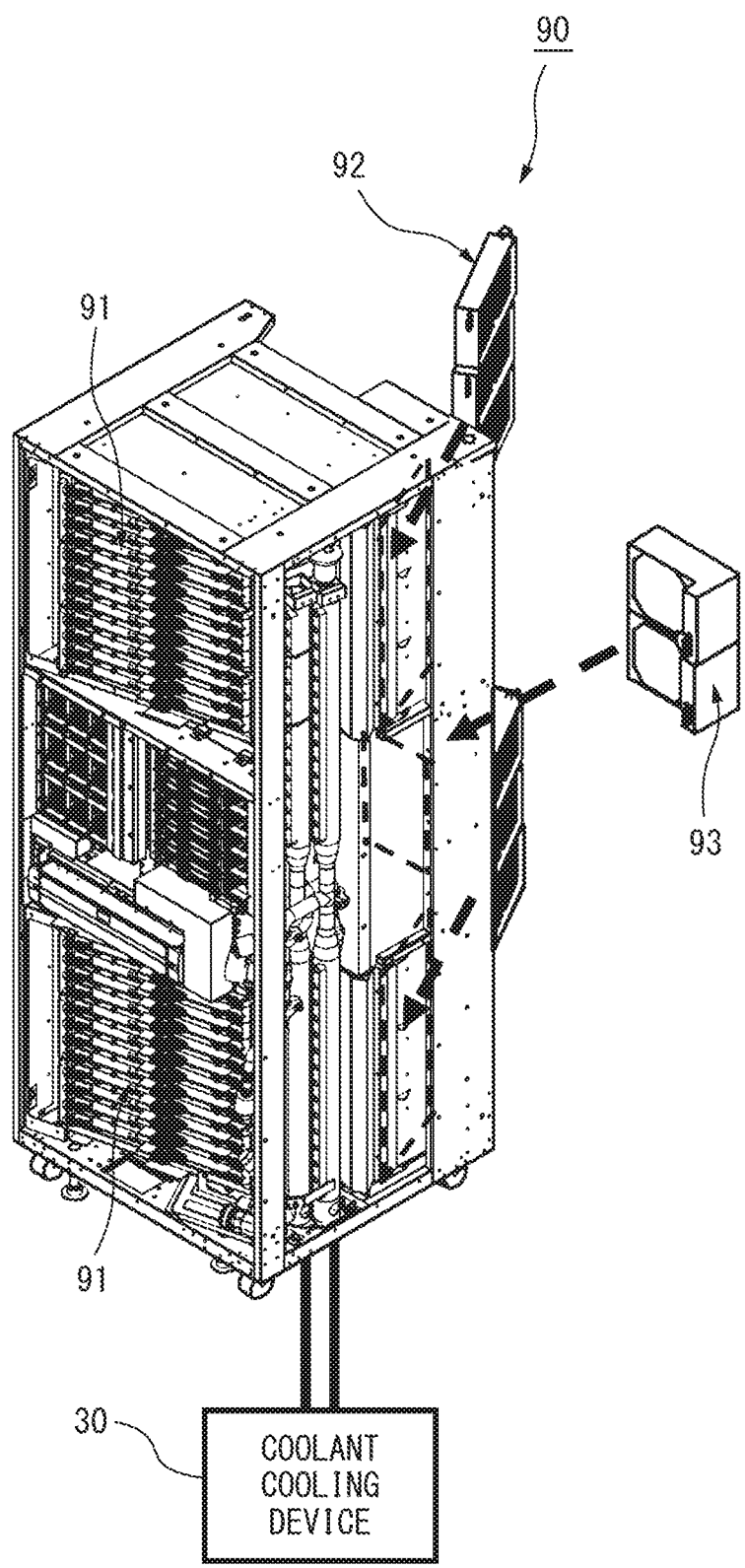
FIG. 1 is a perspective view of a standalone apparatus provided with an air-cooling system and a liquid cooling system of the comparative art.
Figure 2A:
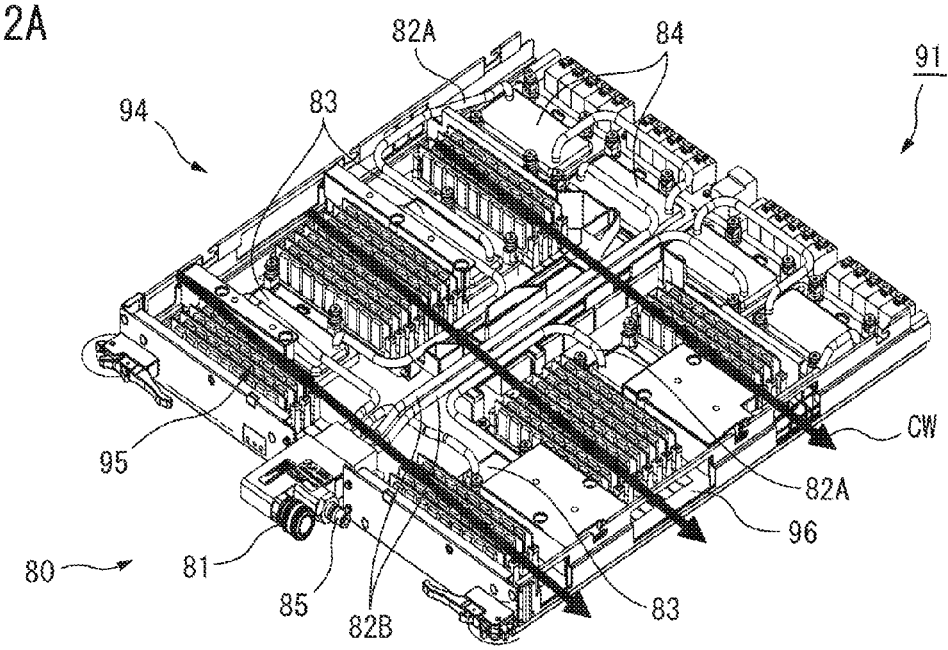
FIG. 2A is a perspective view showing the layout of an air-cooling system and liquid cooling system in a CPU unit mounted in the standalone apparatus illustrated in FIG. 1.
Figure 2B:
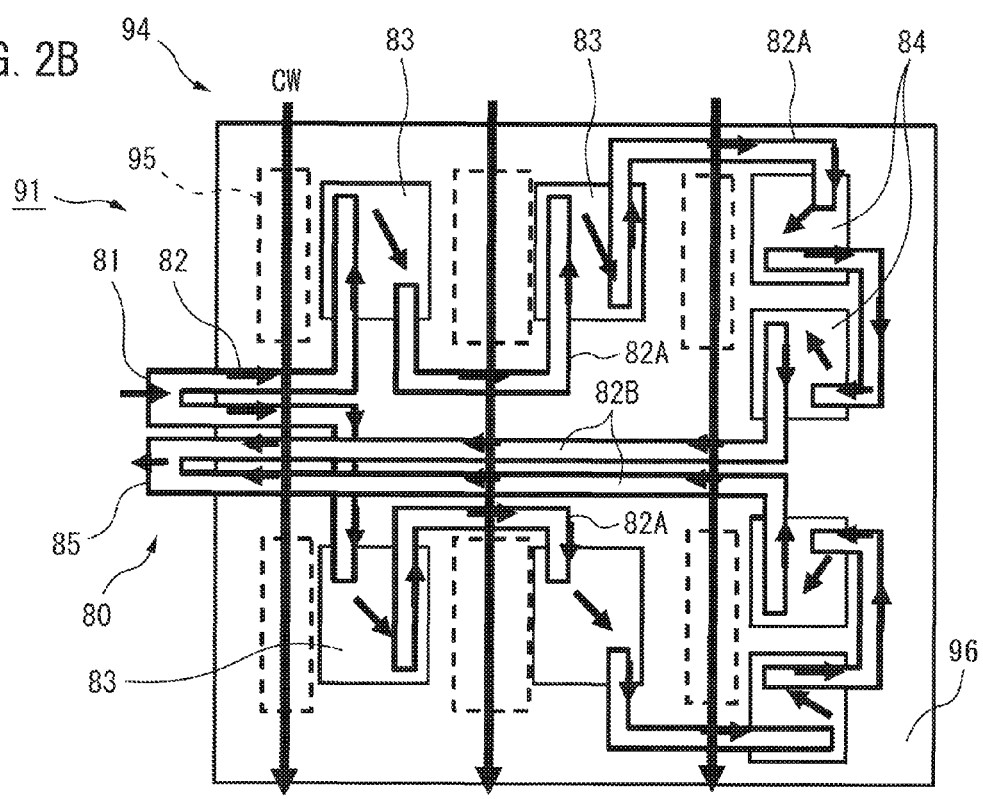
FIG. 2B is a plan view showing the operations of the air-cooling system and liquid cooling system in a CPU unit illustrated in FIG. 2A.
Figure 3:
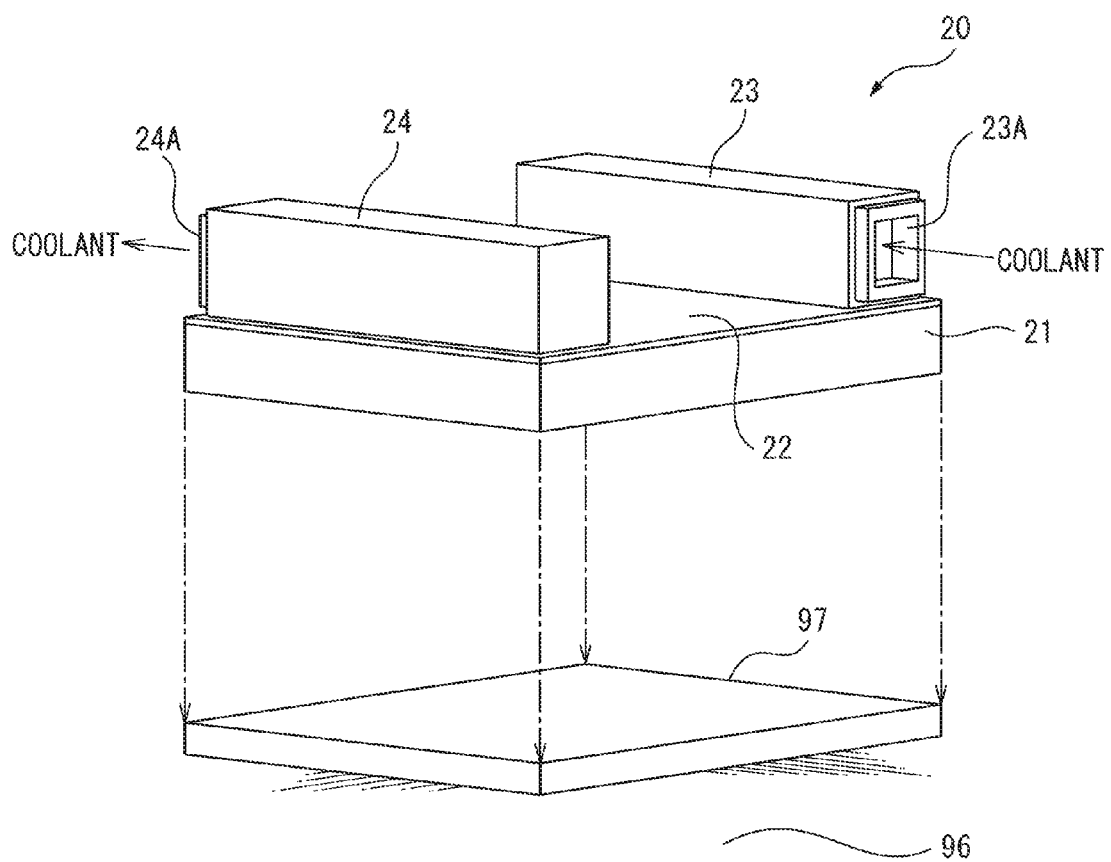
FIG. 3 is a perspective view showing the state where one cooling plate of the liquid cooling system illustrated in FIG. 2B is attached to a heat generating device.
Figure 4:
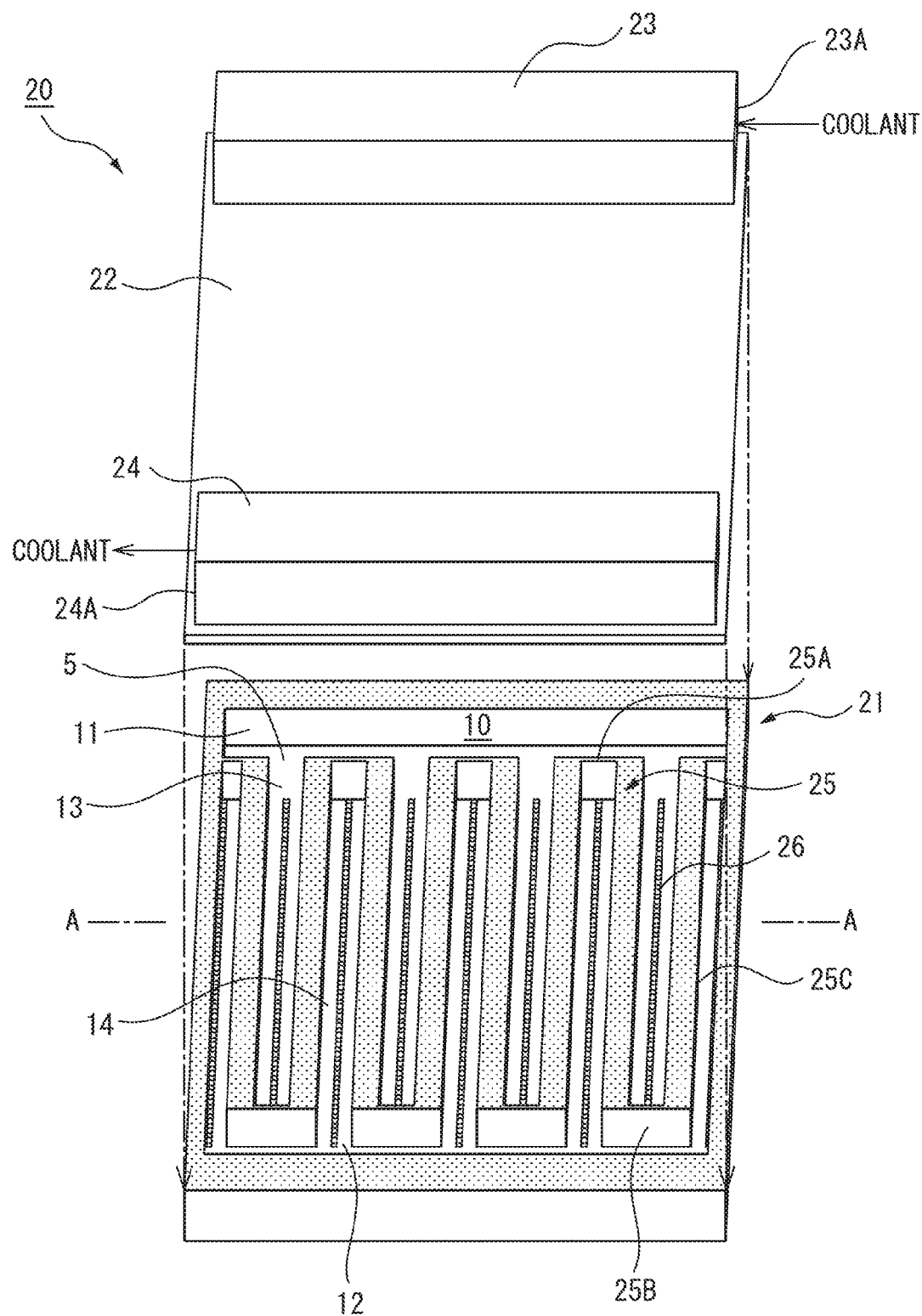
FIG. 4 is a disassembled perspective view showing the state where a cover of the cooling plate illustrated in FIG. 3 is detached.
Figure 5A:
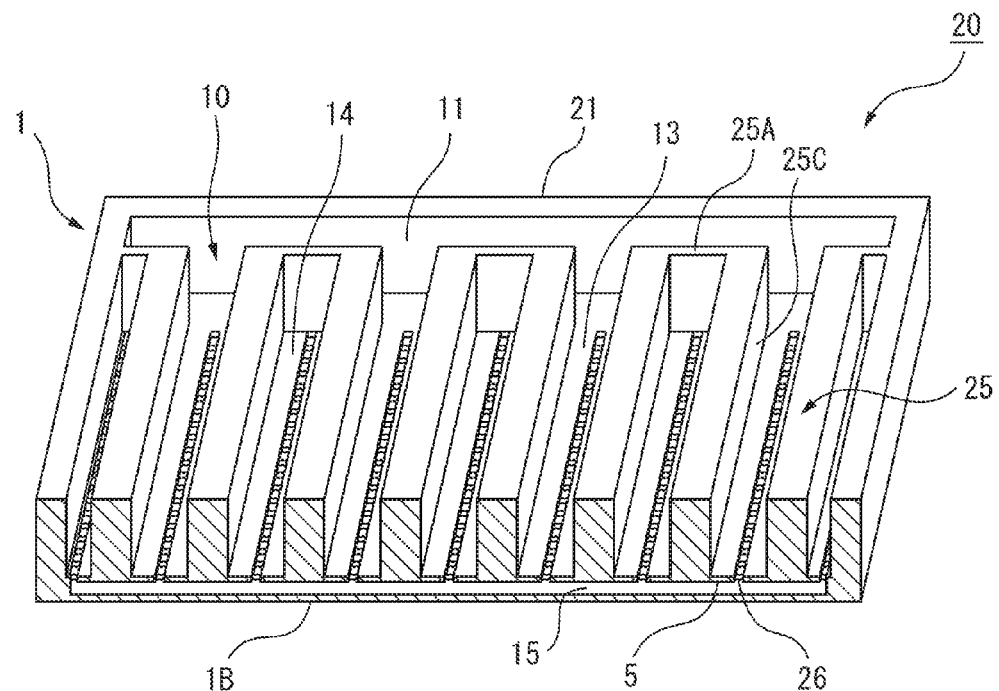
FIG. 5A is a perspective view of a main body part at the coolant inlet side when cutting the cooling plate illustrated in FIG. 4 along the line A-A.
Figure 5B:
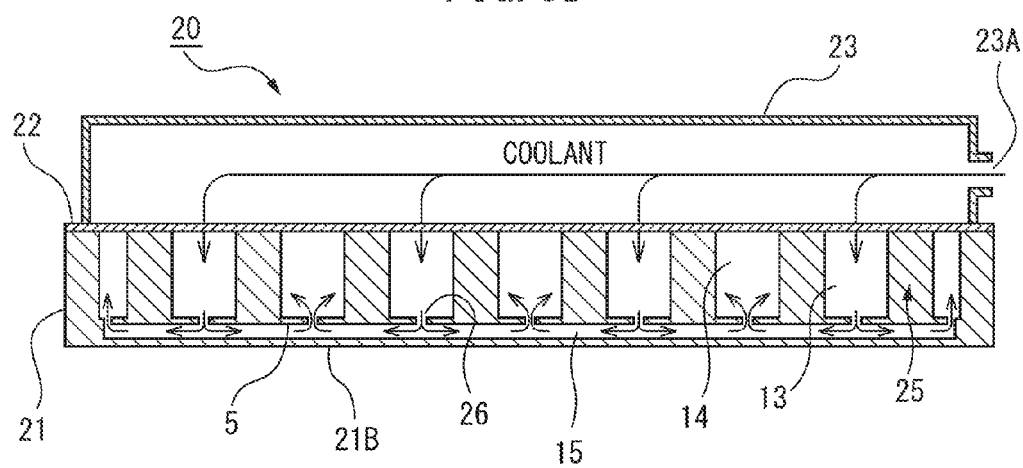
FIG. 5B is an explanatory view showing channels of a coolant in a cooling plate.
Figure 6:
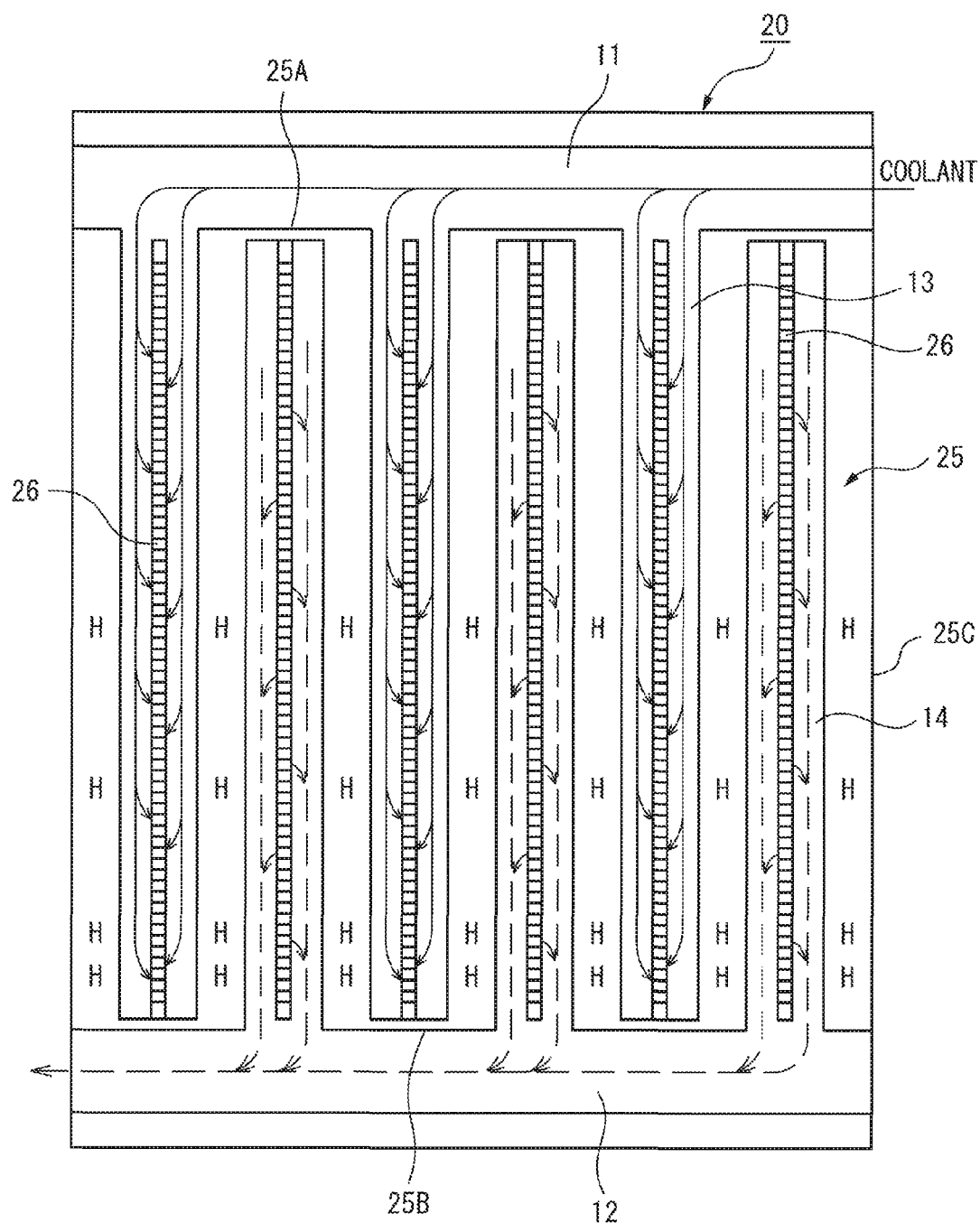
FIG. 6 is a partial plan view of the state where an upper cover of the cooling plate illustrated in FIG. 3 is detached.
Figure 7A:
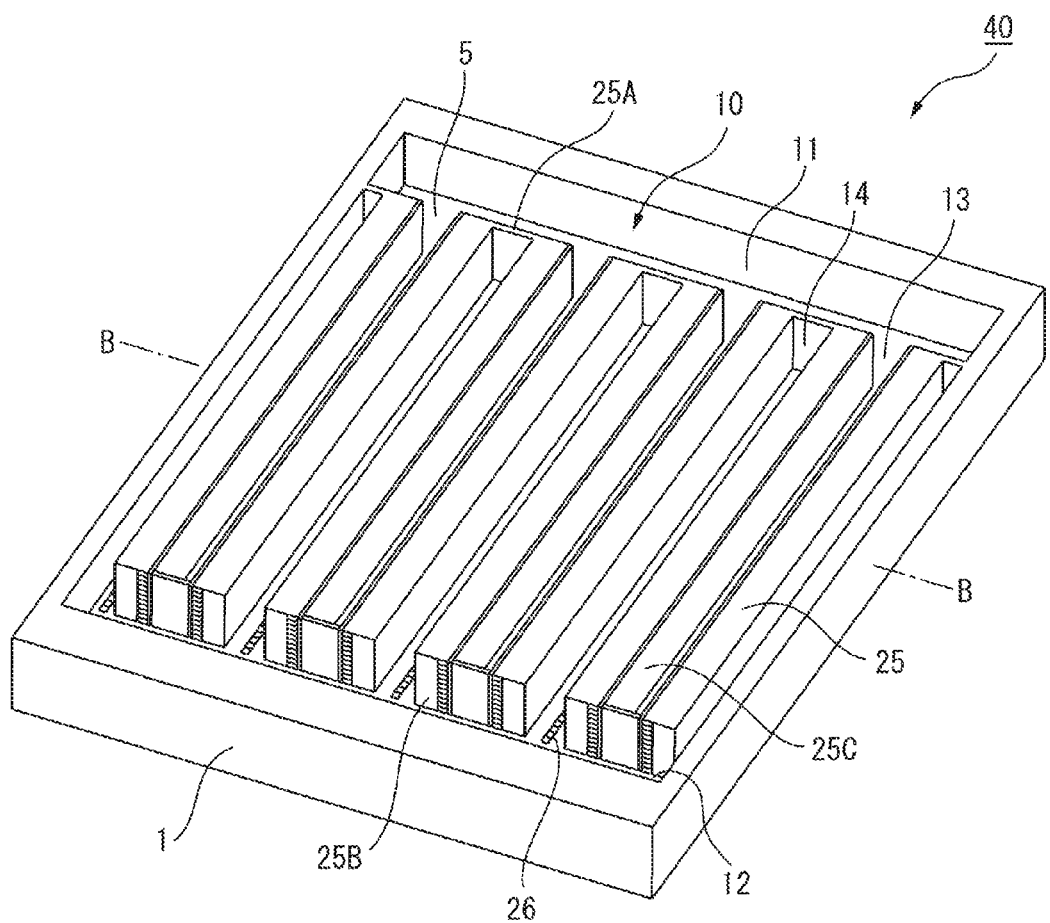
FIG. 7A is a partially cutaway perspective view of a first embodiment of a cooling plate.
Figure 7B:
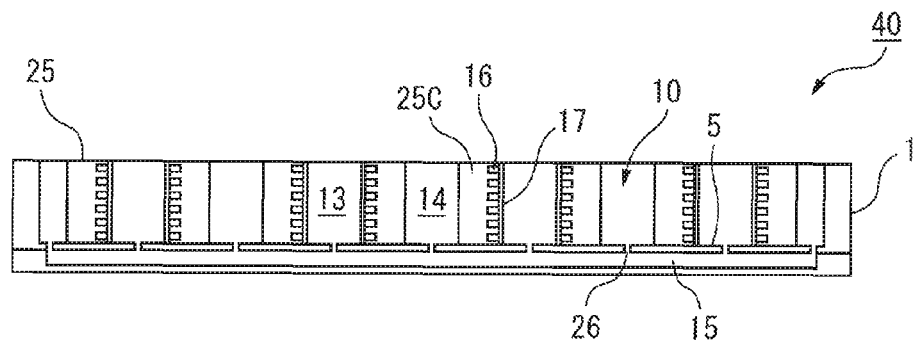
FIG. 7B is a cross-sectional view along the line B-B of FIG. 7A.

FIG. 7A illustrates the structure of a first embodiment of a cooling plate 40 and illustrates the structure of an upper space 10 of the cooling plate 40 in the state after removing a top plate 22 at a top part of the main body 1. Further, FIG. 7B illustrates a cross-section along a line B-B of FIG. 7A. Part of it is enlarged in view in the illustration of FIG. 9A. Further, FIG. 8 illustrates an enlarged part of the first coolant storage part 11 side of the cooling plate 40 illustrated in FIGS. 7A and 7B and explains the structure of the third channel 16 provided at the part of the side walls 25C at the coolant distribution path 13 sides of the partition wall 25.

The structure of the cooling plate 40 of the disclosure is the same as the structure of the cooling plate 20 of the comparative art except for the structure of the part of the partition wall 25. Therefore, the cooling plate 40 has an upper space 10 and a heat removing coolant chamber (lower space) 15 partitioned by a separating wall 5. Inside of the upper space 10, there are a first channel and a second channel partitioned by a meandering type partition wall 25. The first channel is provided with a first coolant storage part 11 and coolant distribution paths 13, while the second channel is provided with coolant collection paths 14 and a second coolant storage part 12.

The plurality of coolant distribution paths 13 connected to the first coolant storage part 11 are formed surrounded by the side walls 25C and the inner circumferential surfaces of the folded back walls 25B. The parts of the separating wall 5 forming the bottom surfaces of the coolant distribution paths 13 are communicated through through holes 26 to a heat removing coolant chamber 15. Similarly, the plurality of coolant collection paths 14 connected to the second coolant storage part 12 are formed surrounded by the side walls 25C and the inner circumferential surfaces of the folded back walls 25A. The parts of the separating wall 5 forming the bottom surfaces of the coolant collection paths 14 are communicated through through holes 26 to the heat removing coolant chamber 15. The coolant running through the coolant distribution paths 13 passes through the through holes 26 to flow into the heat removing coolant chamber 15. The coolant absorbing the heat of the heat generating member at the heat removing coolant chamber 15 passes through the through holes 26 and flows in from the heat removing coolant chamber 15 to the coolant collection paths 14. This point is also the same.

Figure 8:
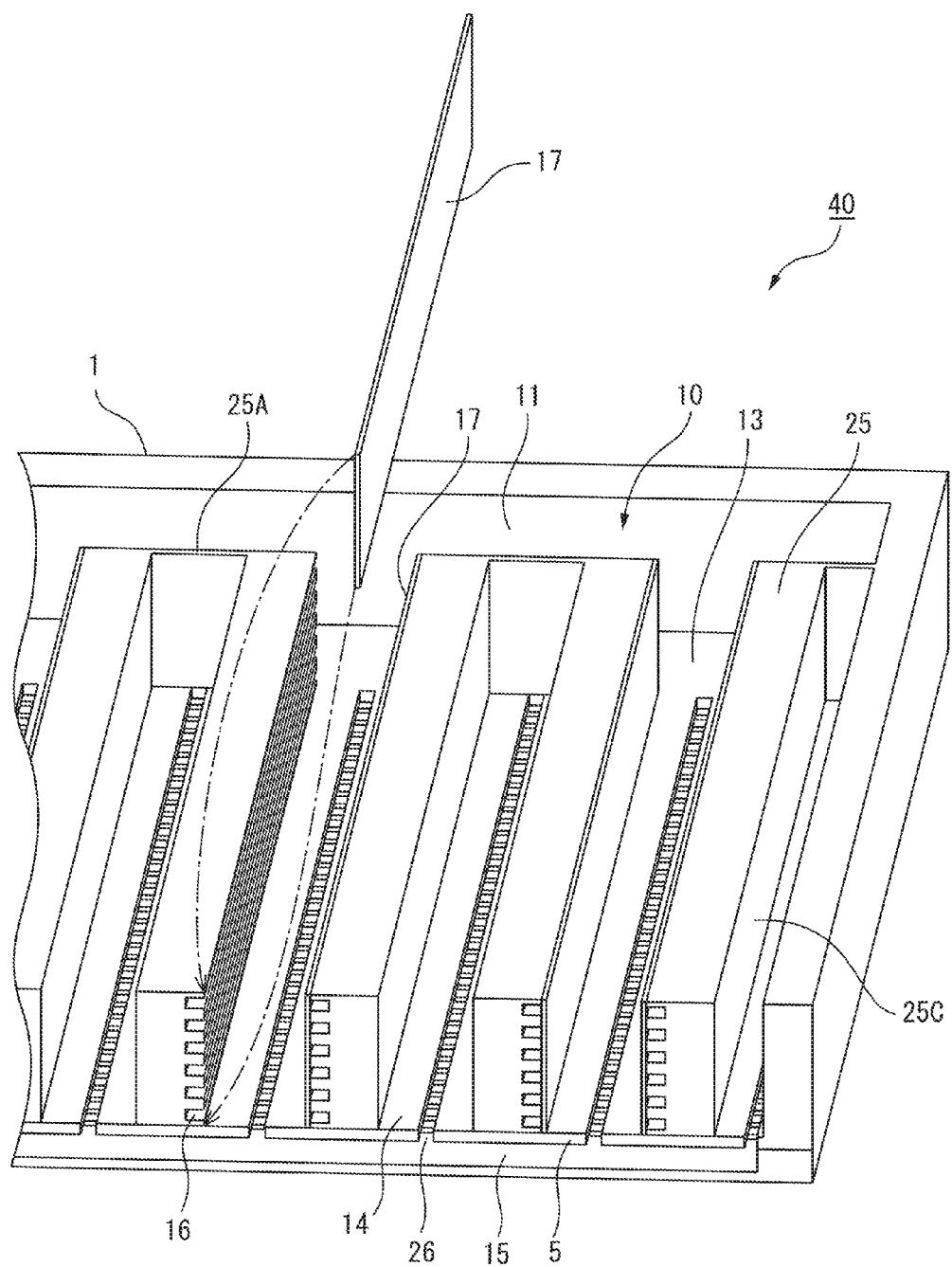
FIG. 8 is a partial perspective view showing the structure of a side wall part of the partition wall of the cooling plate illustrated in FIG. 7.
Figure 9A:
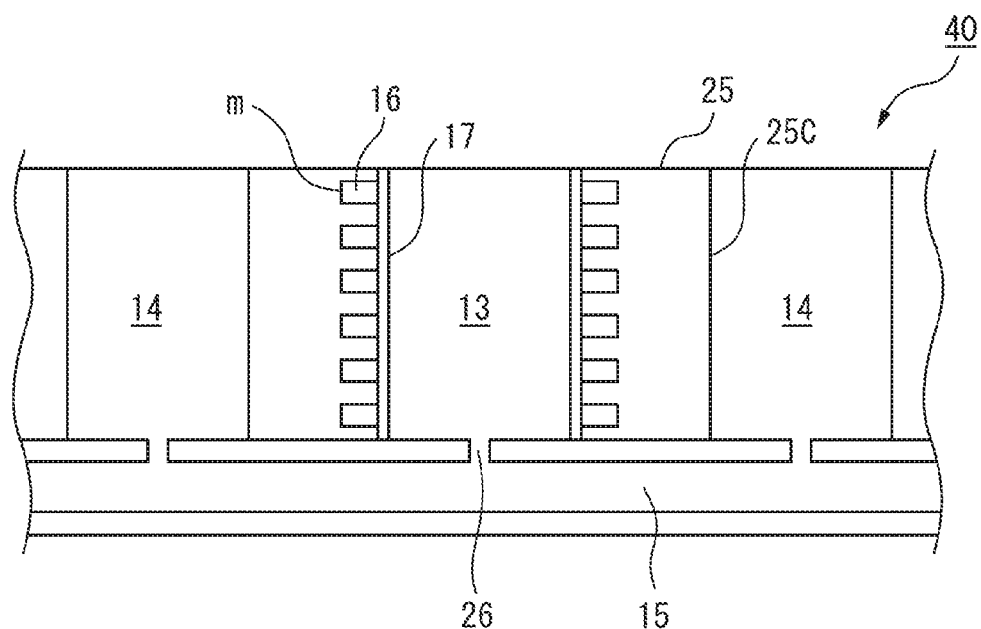
FIG. 9A is a partial cross-sectional view showing a first embodiment of a third channel.

On the other hand, in the cooling plate 40 of the disclosure, as illustrated in FIG. 8 and FIG. 9A, the parts of the side walls 25C at the coolant distribution path 13 sides of the partition wall 25 are formed with a plurality of third channels 16 as subchannels. The third channel 16 illustrated in FIG. 9A illustrates a first embodiment of the third channel 16. The third channel 16 of the first embodiment is formed by pluralities of parallel grooves "m" provided at the side walls 25C sealed by sealing plates 17. The inlet of the third channel 16 opens at the first coolant storage part 11, while the outlet opens at the second coolant storage part 12.

For this reason, in the third channel 16, part of the coolant before absorbing heat at the first coolant storage part 11 flows toward the second coolant storage part 12. Due to this, the coolant before absorbing heat flowing through the third channel 16 enables the rise in temperature of the side walls 25C to be prevented from the upstream side to downstream side of the coolant flowing through the coolant distribution paths 13 and enables the rise in coolant temperature at the downstream sides of the coolant distribution paths 13 of the cooling plate 40 to be suppressed and thereby the cooling ability to be improved.

Figure 9B:
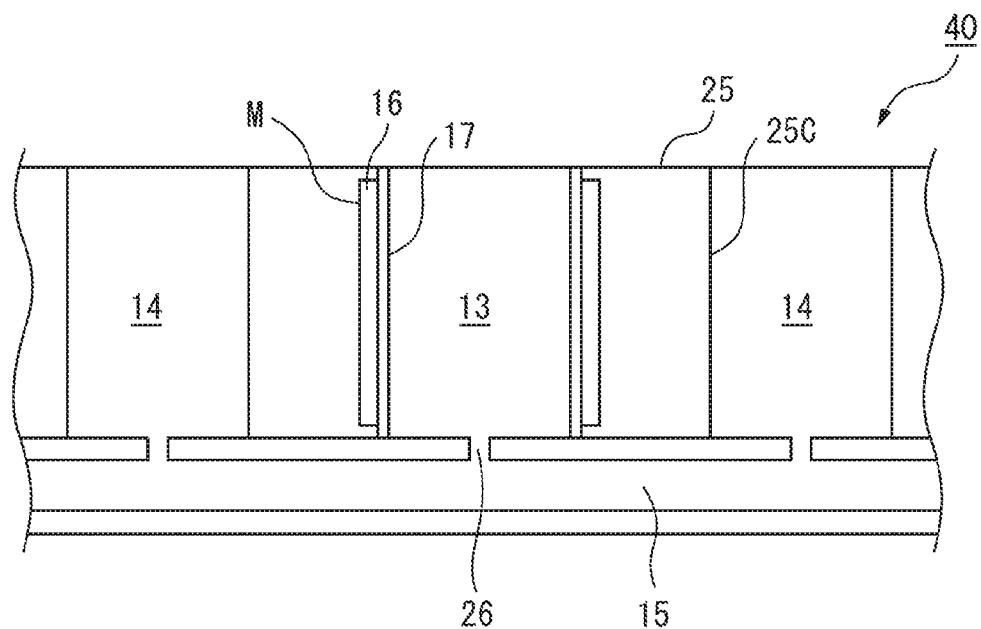
FIG. 9B is a partial cross-sectional view showing a second embodiment of a third channel.

FIG. 9B illustrates a second embodiment of the third channel 16 and illustrates a portion the same as the first embodiment of the third channel 16 illustrated in FIG. 9A. The third channel 16 of the first embodiment was formed by pluralities of parallel grooves m provided at the side walls 25C and sealed by the sealing plates 17. On the other hand, the third channel 16 of the second embodiment is formed by single broad grooves M in the height directions of the side walls 25C. The broad grooves M are sealed by the sealing plates 17 thereby forming the third channel 16.

At the third channel 16 of the second embodiment as well, part of the coolant before absorbing heat of the first coolant storage part 11 flows toward the second coolant storage part 12. For this reason, the coolant before absorbing heat flowing through the third channel 16 enables a rise in temperature of the side wall 25C to be prevented from the upstream side to downstream side of the coolant flowing through the coolant distribution paths 13 and enables the rise in coolant temperature at the downstream sides of the coolant distribution paths 13 of the cooling plate 40 to be suppressed and thereby the cooling ability to be improved.

Figure 10A:
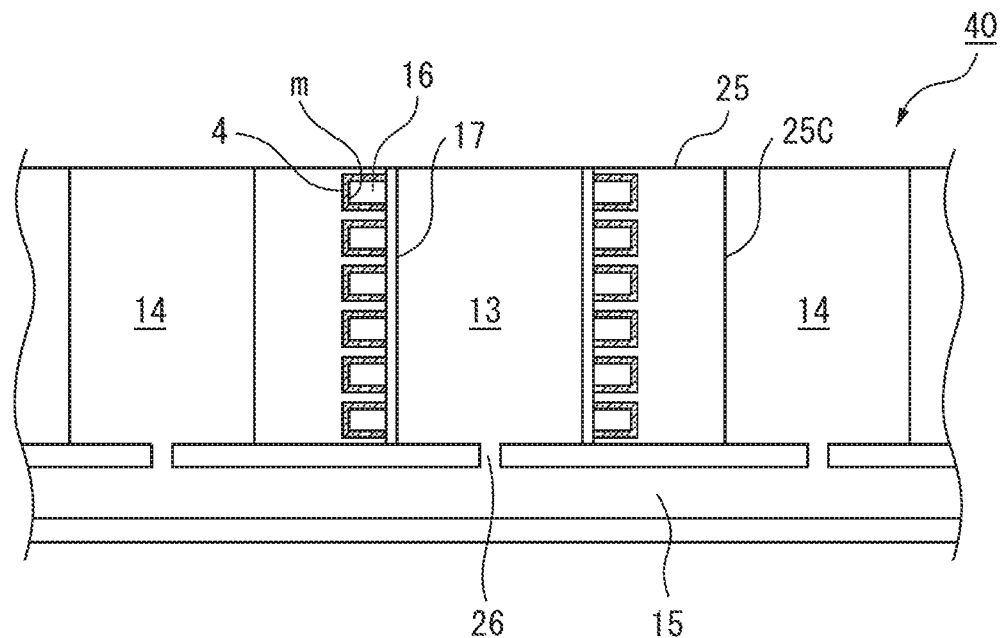
FIG. 10A is a partial cross-sectional view showing a third embodiment of a third channel.

FIG. 10A illustrates a third embodiment of the third channel 16 and illustrates a portion the same as the first embodiment of the third channel 16 illustrated in FIG. 9A. The third channel 16 of the first embodiment was formed by pluralities of parallel grooves m provided at the side walls 25C and sealed by sealing plates 17. On the other hand, the third channel 16 of the third embodiment is comprised of a plurality of parallel grooves m provided at the side walls 25C and having heat insulating members 4 laid over their inner circumferential surfaces. This point is different from the third channel 16 of the first embodiment. The grooves m over which the heat insulating members 4 is laid are sealed by the sealing plates 17. This point is the same as the first embodiment.

If heat insulating members 4 are laid over the inner circumferential surfaces of the grooves m, even if heat from the coolant flowing through the coolant collection paths 14 and absorbing heat of the heat generating member at the heat removing coolant chamber 15 or heat of the separating wall 5 causes the side walls 25C to rise in temperature, due to the heat insulating members 4, it is difficult for the heat of the side walls 25C to be conducted to the coolant flowing through the third channel 16. On the other hand, if forming the sealing plates 17 by members with a high heat conductivity, the coolant before absorbing heat flowing through the third channel 16 causes the sealing plates 17 to fall in temperature. For this reason, a temperature rise of the coolant in the coolant distribution paths 13 contacting the sealing plates 17 is prevented and a rise of the coolant temperature at the downstream sides of the coolant distribution paths 13 of the cooling plate 40 is suppressed and thereby the cooling ability is further improved.

Figure 10B:
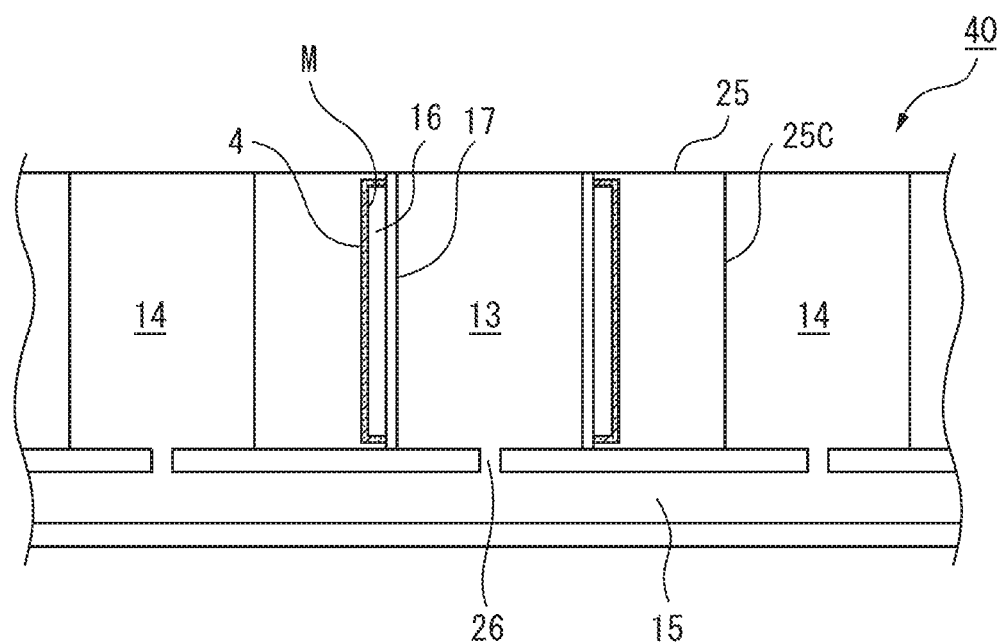
FIG. 10B is a partial cross-sectional view showing a fourth embodiment of a third channel.

FIG. 10B illustrates a fourth embodiment of the third channel 16 and illustrates a portion the same as the second embodiment of the third channel 16 illustrated in FIG. 9B. The third channel 16 of the second embodiment is formed by single broad grooves M in the height directions of the side walls 25C. The broad grooves M are sealed by the sealing plates 17 thereby forming the third channel 16. On the other hand, the third channel 16 of the fourth embodiment is comprised of broad grooves M provided at the side walls 25C and having heat insulating members 4 laid over their inner circumferential surfaces. This point differs from the third channel 16 of the second embodiment. The broad grooves M formed with the heat insulating members 4 laid over then are sealed by the sealing plates 17. This point is the same as the first embodiment.

If the heat insulating members 4 are laid over the inner circumferential surfaces of the grooves M, even if heat from the coolant flowing through the coolant collection paths 14 and absorbing heat of the heat generating member at the heat removing coolant chamber 15 or heat of the separating wall 5 causes the side walls 25C to rise in temperature, due to the heat insulating members 4, it is difficult for the heat of the side walls 25C to be conducted to the coolant flowing through the third channel 16. Here too, if forming the sealing plates 17 by members with a high heat conductivity, the coolant before absorbing heat flowing through the third channel 16 causes the sealing plates 17 to fall in temperature. For this reason, a temperature rise of the coolant in the coolant distribution paths 13 contacting the sealing plates 17 is prevented and a rise of the coolant temperature at the downstream sides of the coolant distribution paths 13 of the cooling plate 40 is suppressed and thereby the cooling ability is further improved.

Figure 11A:
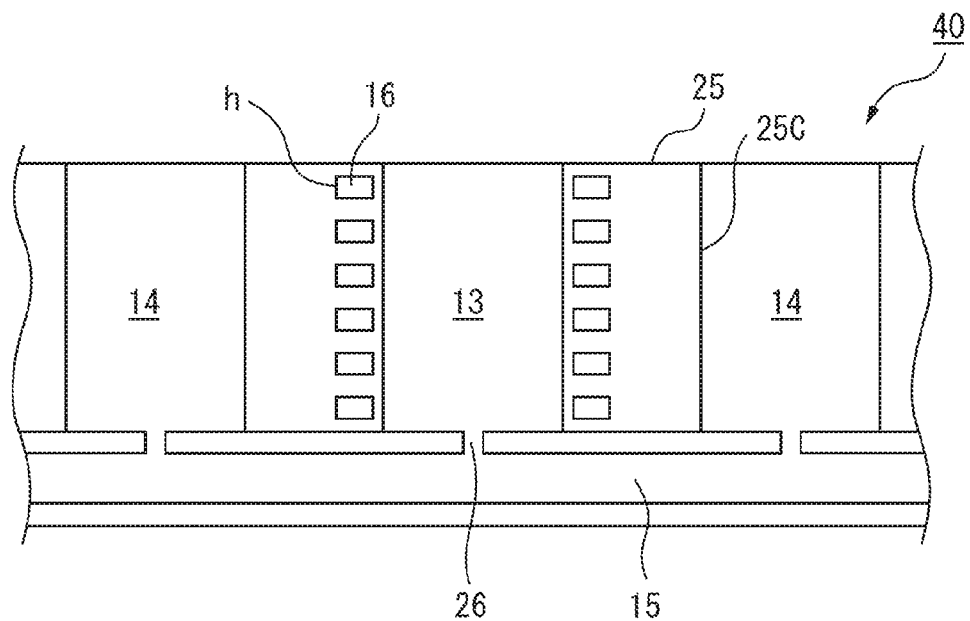
FIG. 11A is a partial cross-sectional view showing a fifth embodiment of a third channel.

FIG. 11A illustrates a fifth embodiment of the third channel 16 and illustrates a portion the same as the first embodiment of the third channel 16 illustrated in FIG. 9A. The third channel 16 of the first embodiment was formed by pluralities of parallel grooves m provided at the side walls 25C and sealed by the sealing plates 17. On the other hand, the third channel 16 of the fifth embodiment is formed by pluralities of parallel holes h in the side walls 25C at the sides close to the coolant distribution paths 13. This point differs from the third channel of the first embodiment. In the third channel 16 of the fifth embodiment, part of the coolant before absorbing heat flows through the pluralities of parallel holes h toward the second coolant storage part 12.

For this reason, the coolant before absorbing heat flowing through the third channel 16 enables the temperature rise of the side walls 25C to be prevented from the upstream sides to the downstream sides of the coolant flowing through the coolant distribution paths 13 and enables the rise in coolant temperature at the downstream sides of the coolant distribution paths 13 of the cooling plate 40 is be suppressed and thereby the cooling ability to be improved. Note that, the cross-sectional shape of the holes h is not limited to a rectangle and may also be a circle etc.

Figure 11B:
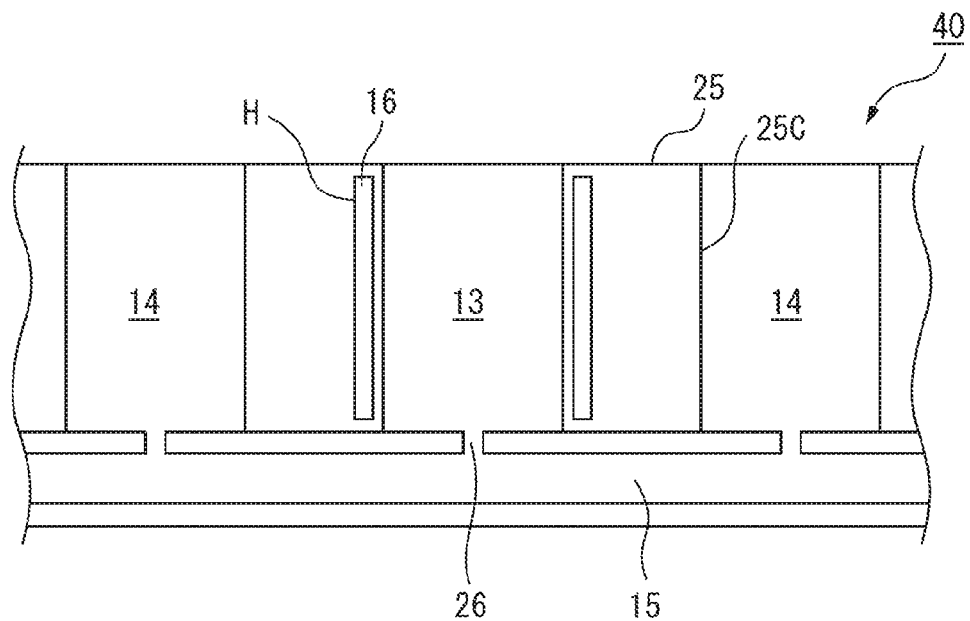
FIG. 11B is a partial cross-sectional view showing a sixth embodiment of a third channel.

FIG. 11B illustrates a sixth embodiment of the third channel 16 and illustrates a portion the same as the second embodiment of the third channel 16 illustrated in FIG. 9B. The third channel 16 of the second embodiment is formed by single broad grooves M in the height directions of the side walls 25C. The broad grooves M are sealed by the sealing plates 17 to thereby form the third channel 16. On the other hand, the third channel 16 of the sixth embodiment is formed with single broad holes H at the insides of the side walls 25C at the sides near the coolant distribution paths 13. This point differs from the third channel 16 of the second embodiment. In the third channel 16 of the sixth embodiment, part of the coolant before absorbing heat flows through the single broad holes H toward the second coolant storage part 12.

For this reason, the coolant before absorbing heat flowing through the third channel 16 enables the temperature rise of the side walls 25C to be prevented from the upstream sides to the downstream sides of the coolant flowing through the coolant distribution paths 13 and enables the rise in coolant temperature at the downstream sides of the coolant distribution paths 13 of the cooling plate 40 to be suppressed and thereby the cooling ability to be improved.

FIG. 12A is a partial plan view of a first embodiment of the cooling plate 40. For the third channel 16, any of the third channels 16 of the above-mentioned first to sixth embodiments is provided. In the first embodiment of the cooling plate 40, the coolant inlet of the third channel 16 opens at the first coolant storage part 11, while the coolant outlet of the third channel 16 opens at the second coolant storage part 12. For this reason, the coolant flowing through the inside of the third channel 16 is discharged to the second coolant storage part 12. On the other hand, the coolant outlet of the third channel 16, as illustrated in the modified embodiment illustrated in FIG. 12B, may be made to open inside the coolant collection paths 14.

Figure 13:
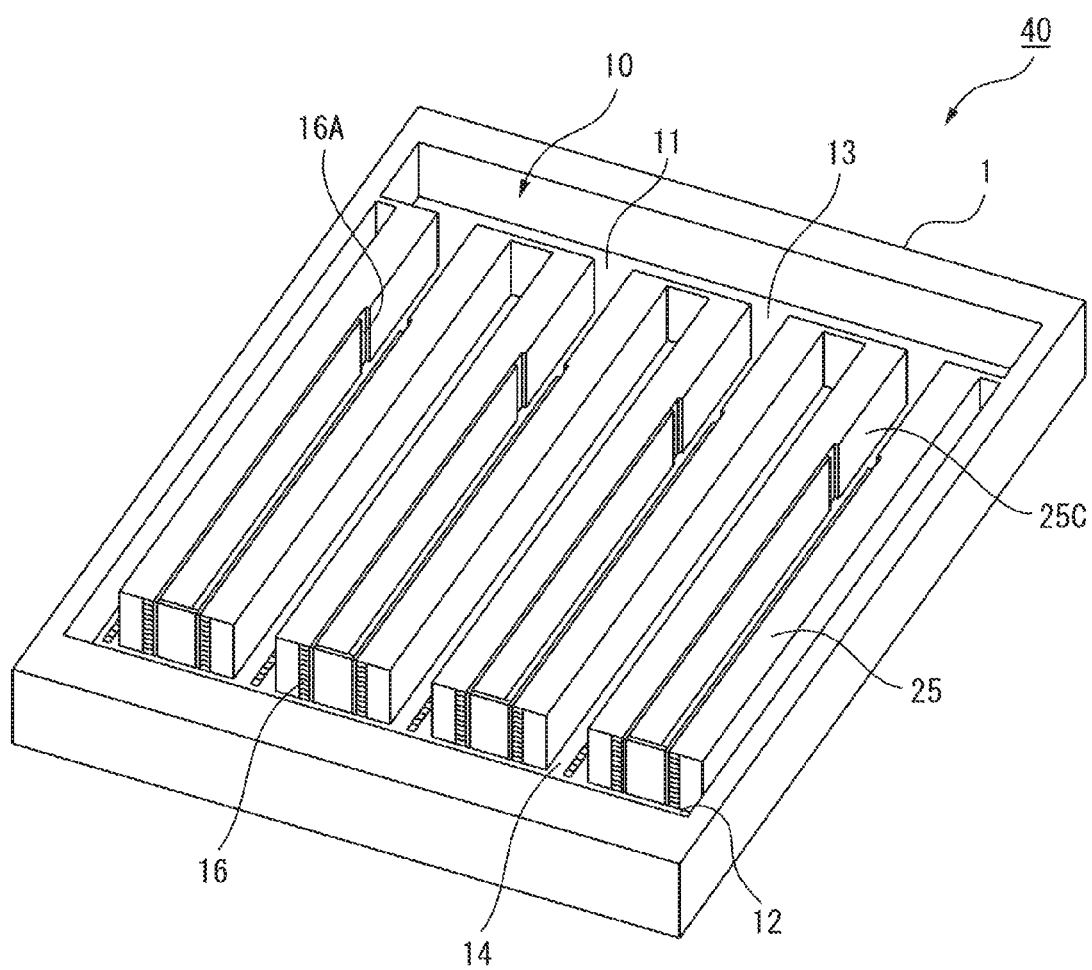
FIG. 13 is a partial cutaway perspective view showing a second embodiment of a cooling plate.

FIG. 13 illustrates the configuration of a second embodiment of the cooling plate 40. In the cooling plate 40 of the second embodiment, the inlet 16A of the coolant of the third channel 16 of the first to sixth embodiments is provided in the middle of the coolant distribution paths 13. This point differs from the cooling plate 40 of the first embodiment. In the cooling plate 40 of the second embodiment, coolant before absorbing heat is made to flow from the middle of the coolant distribution paths 13 into the third channel 16. This is because at the upstream sides of the coolant distribution paths 13, the side walls 25C do not rise much in temperature and the coolant temperature at the upstream sides of the coolant distribution paths 13 is not affected much by the side walls 25C.

In this way, even if making coolant before absorbing heat flow in from the middle of the coolant distribution paths 13, it becomes possible to supply low temperature coolant to the downstream sides where the temperature rise is particularly remarkable. An effect of reduction of the pressure loss caused at the third channel 16 is also obtained.

FIG. 14A illustrates the configuration of a first embodiment of a data processing system 50 provided with cooling plates 40. In the first embodiment, a board 6 is provided with a plurality of heat generating devices 7. Each heat generating device 7 has a cooling plate 40 attached to it. Further, the upper spaces 10 of the cooling plates 40 are connected in series by a coolant feed pipe 82A. According to the data processing system 50 provided with cooling plates 40 of the disclosure, the cooling plates 40 evenly remove the heat from the heat generating devices 7, so there is no drop in performance of the heat generating devices 7 and no drop in the processing efficiency.

FIG. 14B illustrates the configuration of a second embodiment of a data processing system 50 provided with cooling plates 40. In the second embodiment, a board 6 is provided with a plurality of heat generating devices 7. Each heat generating device 7 has a cooling plate 40 attached to it. Further, the upper spaces 10 of the cooling plates 40 are connected in parallel by a coolant feed pipe 82A. According to the data processing system 50 provided with cooling plates 40 of the disclosure, the cooling plates 40 evenly remove the heat from the heat generating devices 7, so there is no drop in performance of the heat generating devices 7 and no drop in the processing efficiency.

According to the cooling plate of the disclosure, part of the coolant flows along the partition wall before absorption of heat whereby the partition wall is cooled, so there is the effect that the coolant flowing along the first channel does not easily rise in temperature due to heat conduction from the partition wall and the cooling ability of the cooling plate at the outlet side of the coolant is improved. According to the data processing system provided with cooling plates of this disclosure, the cooling plates evenly remove the heat from the heat generating devices, so there is no drop in performance of the heat generating devices and no drop in the processing efficiency.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A cooling plate comprising:
a main body provided with an upper space and a lower space separated by a separating wall and having a bottom surface placed on a heat generating member,
a partition wall provided sticking out at said upper space side of said separating wall and partitioning the inside of said upper space into a first channel through which the coolant before absorbing heat flows and a second channel through which said coolant after absorbing heat of said heat generating member flows,
a plurality of through holes provided in said separating wall for running said coolant in said first channel into said lower space and running said coolant in said lower space into said second channel, and
a third channel provided in said partition wall and running part of said coolant before absorbing heat.

2. The cooling plate according to claim 1, wherein
said partition wall is a meandering type provided with folded back walls and side walls,
said first channel is formed from a first coolant storage part positioned at the outside of first walls of said folded back walls into which coolant flows from the outside and coolant distribution paths surrounded by the inner circumferential surfaces of the second walls of said folded back walls and said side walls positioned at the two sides of the same and connected to said first coolant storage part, and
said second channel is formed from a second coolant storage part positioned at the outside of the second walls of of said folded back walls at which said coolant discharged to the outside is collected and coolant collection paths surrounded by the inner circumferential surfaces of the the second walls of said folded back walls and said side walls positioned at the two sides of the same and connected to said second coolant storage part.

3. The cooling plate according to claim 2, wherein said through holes are provided at the bottom surfaces of said coolant distribution paths and the bottom surfaces of said coolant collection paths along the directions in which said coolant flows.

4. The cooling plate according to claim 2, wherein said third channel is formed at the side walls of said partition wall positioned at the two side surfaces of said coolant distribution paths.

5. The cooling plate according to claim 4, wherein said third channel is formed by pluralities of subchannels in parallel in up-down directions of side walls of said partition wall.

6. The cooling plate according to claim 4, wherein said third channel is formed by indentations in the side walls of said partition wall, the surfaces of said third channel contacting said coolant distribution paths are formed by members high in heat conductivity, and the remaining inner circumferential surfaces of said third channel have heat insulating members laid over them.

7. The cooling plate according to claim 1, wherein said third channel is formed at the insides of said partition wall.

8. The cooling plate according to claim 7, wherein said third channel is formed by pluralities of subchannels in parallel at the insides of said partition wall.

9. The cooling plate according to claim 2, wherein an outlet of said coolant of said third channel opens at a side wall of said partition wall facing said coolant collection paths.

10. The cooling plate according to claim 2, wherein an outlet of said coolant of said third channel opens at an inside of said second coolant storage part.

11. A data processing system provided with cooling plates which use a coolant to cool heat generating devices mounted on a board on which data processing circuits are formed, each said cooling plate comprising
    a main body provided with an upper space and a lower space separated by a separating wall and having a bottom surface placed on a heat generating member,
    a partition wall provided sticking out at said upper space side of said separating wall and partitioning the inside of said upper space into a first channel through which the coolant before absorbing heat flows and a second channel through which said coolant after absorbing heat of said heat generating member flows,
    a plurality of through holes provided in said separating wall for running said coolant in said first channel into said lower space and running said coolant in said lower space into said second channel, and
    a third channel provided in said partition wall and running part of said coolant before absorbing heat.

12. The data processing system provided with cooling plates according to claim 11, wherein said board is provided with a plurality of said heat generating devices, said heat generating devices respectively have said cooling plates attached to them, and said upper spaces of said cooling plates are connected in series.

13. The data processing system provided with cooling plates according to claim 11, wherein said board is provided with a plurality of said heat generating devices, said heat generating devices respectively have said cooling plates attached to them, and said upper spaces of said cooling plates are connected in parallel.

\* \* \* \* \*